(12) United States Patent
Le-Briz et al.

(10) Patent No.: US 9,245,914 B2
(45) Date of Patent: Jan. 26, 2016

(54) ELECTRONIC DEVICE COMPRISING A CHIP OF INTEGRATED CIRCUITS STACKED WITH AN OPTICAL PLATE

(71) Applicant: STMicroelectronics (Grenoble 2) SAS, Grenoble (FR)

(72) Inventors: Olivier Le-Briz, Saint-Gervais (FR); Romain Coffy, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/552,800

(22) Filed: Nov. 25, 2014

(65) Prior Publication Data

US 2015/0155324 A1   Jun. 4, 2015

(30) Foreign Application Priority Data

Nov. 29, 2013   (FR) ..................................... 13 61843

(51) Int. Cl.
*H01L 31/0203* (2014.01)
*H01L 27/146* (2006.01)

(52) U.S. Cl.
CPC .... *H01L 27/14636* (2013.01); *H01L 27/14618* (2013.01); *H01L 31/0203* (2013.01)

(58) Field of Classification Search
CPC .................. H01L 27/14618; H01L 27/14636; H01L 31/0203
USPC .................................. 257/433, 432, 434, 202
See application file for complete search history.

(56) References Cited

U.S. PATENT DOCUMENTS

| | | | |
|---|---|---|---|
| 6,911,392 B2 | 6/2005 | Bieck et al. | |
| 6,969,898 B1* | 11/2005 | Exposito | ............... H01L 25/167 257/434 |
| 2004/0031973 A1* | 2/2004 | Cognetti | ............. H01L 31/0203 257/202 |
| 2010/0252902 A1* | 10/2010 | Tanida | .............. H01L 27/14618 257/433 |
| 2010/0327383 A1* | 12/2010 | Hayasaki | .......... H01L 21/76898 257/432 |
| 2011/0180891 A1* | 7/2011 | Lin | ...................... H01L 21/6835 257/432 |
| 2012/0306038 A1* | 12/2012 | Chow | ................. H01L 27/14618 257/434 |
| 2013/0292787 A1* | 11/2013 | Yang | ................. H01L 27/14618 257/432 |
| 2013/0320471 A1* | 12/2013 | Luan | ................. H01L 27/14618 257/432 |

OTHER PUBLICATIONS

INPI Search Report and Written Opinion for FR1361843 dated Feb. 14, 2014 (7 pages).

* cited by examiner

*Primary Examiner* — Mohammed Shamsuzzaman
(74) *Attorney, Agent, or Firm* — Gardere Wynne Sewell LLP

(57) ABSTRACT

An electronic device is formed by a stack of an integrated circuit chip and an optical plate. The integrated circuit chip includes integrated circuits (such as optical circuits) formed on or in a semiconductor substrate plate. The optical integrated circuits may form an optical sensor. An electrical connection network is provided on the top side of the semiconductor substrate plate. Electrical connection lugs, which are connected to the electrical connection network through electrical connection vias, are mounted on the back side of the semiconductor substrate plate. The vias are through silicon vias situated at a distance from the periphery of the semiconductor substrate plate. The optical plate is configured to allow light radiation to pass to the optical integrated circuits.

12 Claims, 2 Drawing Sheets

ELECTRONIC DEVICE COMPRISING A CHIP OF INTEGRATED CIRCUITS STACKED WITH AN OPTICAL PLATE

PRIORITY CLAIM

This application claims priority from French Application for Patent No. 1361843 filed Nov. 29, 2013, the disclosure of which is incorporated by reference.

TECHNICAL FIELD

The present invention relates to the field of electronic devices which comprise electronic chips including an optical sensor.

BACKGROUND

An electronic device widely implemented currently comprises a support plate on a front face of which is fixed a chip of integrated circuits including an optical sensor in a front face. The support plate is equipped with an electrical connection network, front lugs of which are connected to front lugs of the chip of integrated circuits by electrical connection wires. The chip of integrated circuits and the electrical connection wires are buried in an encapsulation material formed on the front face of the support substrate plate. The electrical connection network of the support plate comprises electrical connection lugs arranged on the back face of this plate with a view to an electrical connection of the chip on a printed circuit board.

Owing to the fact that the support plate must have a larger surface area than that of the chip in order to receive the connections of the electrical connection wires around the chip, owing to the fact that the wires go beyond the front face of the chip in order to be connected onto this front face, owing to the fact that the encapsulation material must have a thickness allowing the total encapsulation of wires on the front face of the support plate, and owing to the very existence of the support plate, the possibilities of reducing the dimensions of such an electronic device are limited and do not allow a sufficient miniaturization to be attained in order to meet today's demands in equipment such as telephones or other portable devices.

SUMMARY

According to one variant embodiment, an electronic device is provided comprising, in a stack: a chip of integrated circuits which comprises a substrate plate equipped with an optical sensor and with an electrical connection network and which is equipped, on a first side, with electrical connection lugs connected to the electrical connection network by means of electrical connection vias situated at a distance from its periphery, and an optical plate allowing light radiation to pass, mounted on top of a second side of the chip opposite to the first side.

The electrical connection vias can be formed through the substrate plate.

The electrical connection vias can be formed in a layer including said electrical connection network.

An opaque encapsulation material can surround said chip and said transparent plate.

The chip can comprise a thinned substrate plate.

The electronic device can furthermore comprise a printed circuit board equipped with electrical connection lugs connected to the electrical connection lugs.

The substrate plate can, in particular, have a thickness equal to or less than 100 microns.

The optical plate can, in particular, have a thickness equal to or less than 300 microns.

BRIEF DESCRIPTION OF THE DRAWINGS

Electronic devices according to variant embodiments of the present invention will now be described by way of non-limiting examples, illustrated by the drawing in which.

DETAILED DESCRIPTION OF THE DRAWINGS

Figure 1:
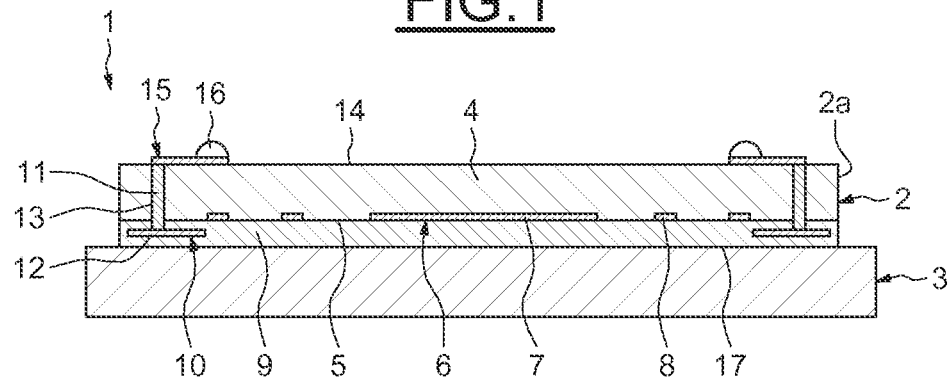
FIG. 1 shows a cross-section of an electronic device.

According to one exemplary embodiment illustrated in FIG. 1, an electronic device 1 comprises a chip of integrated circuits 2 and an optical plate 3, stacked on top of one another.

The chip 2 comprises a substrate plate 4, generally made of silicon, one face 5 of which is processed in such a manner that it comprises electronic components 6, amongst which are an optical or light sensor 7 arranged on a substantially central region of this face 5, and auxiliary electronic components 8 arranged on the region between this central region and the periphery of this face 5.

On the face 5, a frontal or front layer 9 is arranged including an electrical connection network 10 comprising one or more metal levels and selectively connected to the electronic components 6, preferably leaving the central region, corresponding to the optical sensor 7, uncovered and frontally free of metal parts.

The chip 2 comprises a plurality of electrical connection vias 11 that pass through the substrate plate 4, at a distance from its periphery 2a, and respectively reach specific points 12 of the electrical connection network 10, situated in a metal level of this network 12, for example in the first metal level.

The electrical connection vias 11 are formed in holes 13 passing through the substrate plate 4 from one face to the other and, if necessary, are extended into the frontal layer 9 in order to expose the specific points 12 of the electrical connection network 10.

According to one exemplary embodiment, the electrical connection vias 11 can be formed close to the periphery 2a of the substrate plate 4 and on a peripheral region free of electronic components 6.

On the back face 14 of the substrate plate 4, an electrical connection network 15 is formed, for example on a metal level, allowing the electrical connection vias 11 to be selectively connected to external electrical connection elements 16 such as beads, pillars or dots or local thin layers of solder.

According to the present description, the plate 3, referred to as "optical plate", is capable of allowing light radiation to pass and comprises, for example, a glass plate potentially treated and/or covered with a film in such a manner as to form a light filter and/or covered or etched with a desired pattern.

The chip 2 and the optical plate 3 are stacked one on top of the other in a position such that the optical plate 3 is situated on the side of the optical sensor 7 and are fixed by means of a layer of transparent or translucent adhesive 17 running between the front face of the frontal layer 9 of the chip 2 and the optical plate 3.

Thus, light radiation passing through the optical plate 3, while potentially being filtered, can reach the optical sensor 7 of the chip 2.

According to one variant embodiment, the frontal layer 9 allows the light radiation to pass. According to another variant embodiment, the frontal layer 9 has an opening in front of the optical sensor 7 so as to allow the light radiation to pass.

The result of the above is that the electrical connection elements 16 are on one side of the chip 2 and that the optical plate 3 is on the other side of the chip 2.

Figure 2:
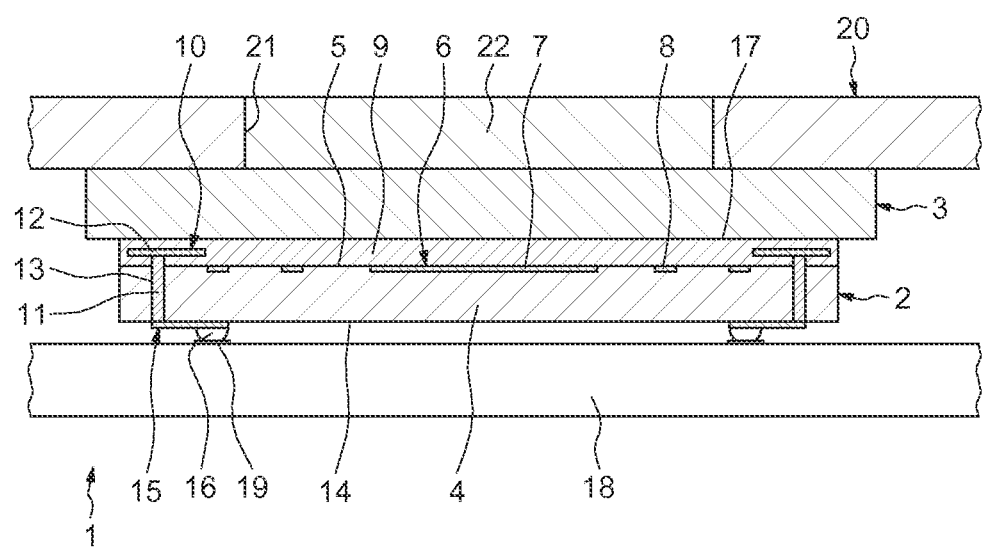
FIG. 2 shows one mounting of the electronic device in FIG. 1.

As illustrated in FIG. 2, the electronic device 1, composed of the chip 2 and of the optical plate 3, is thus immediately ready to be mounted for example onto a printed circuit board 18 or, in an equivalent manner, a flexible film equipped with an electrical connection network, in a position such that the external electrical connection elements 16, situated on the opposite side from the optical plate 3, are soldered onto lugs 19 of this printed circuit board 18.

The printed circuit board 18, equipped with the electronic device 1 and with other electronic components (not shown) can then be installed in an opaque housing 20 having an opening 21 situated on the side of the optical plate 3 and in front of the optical sensor 7, this opening 21 being able to be closed off by a transparent protection plate 22. The optical sensor 7 of the chip 2 is then sensitive to light radiation external to the housing 20 and passing through the opening 21.

The chip 2 may be produced from a collective fabrication of a plurality of chips, comprising for example the following steps.

In locations corresponding to the chips to be obtained, established according to a matrix, blind holes are formed in a thick substrate plate, and they are filled with a material designed to form the electrical connection vias 11.

On the front side of the thick substrate through which the blind holes are formed, electronic components 6 are formed in each location and a frontal layer having, in each location, an electrical connection network 10.

By using a support plate for temporary holding, the thick substrate plate is thinned, for example by scraping, in such a manner as to expose the ends of the vias, then electrical connection networks 15 are formed and electrical connection elements 16 in each location.

Subsequently, the chips 2 formed collectively are diced up, for example by sawing around said locations.

Figure 3:
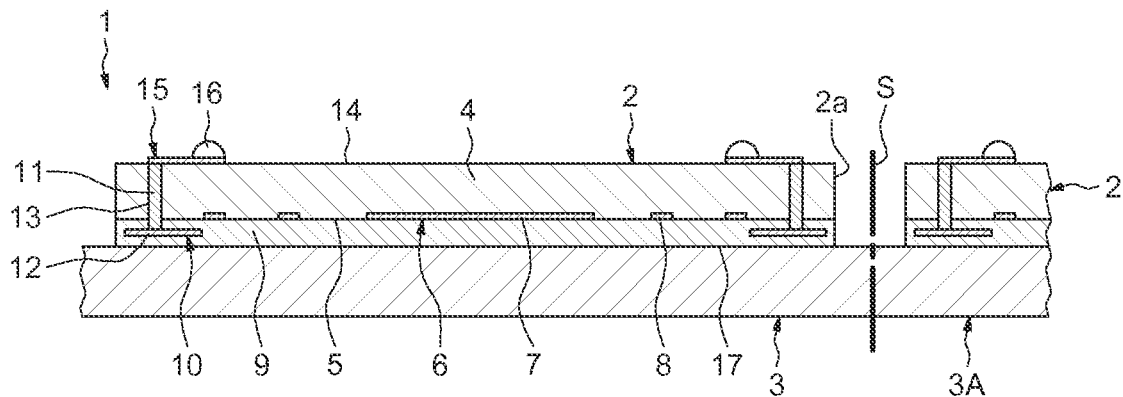
FIG. 3 shows one embodiment of the electronic device in FIG. 1.

Then, as illustrated in FIG. 3, the chips 2 are installed on locations of a collective optical plate 3A, spaced out from one another according to a matrix. During this step, the defective chips can be rejected, only the acceptable chips being installed on the optical plate 3A.

Then, the optical plate 3A is sawn up according to lines S, around each location of this optical plate 3A and passing between the chips 2, in such a manner as to dice up the electronic devices 1 thus formed.

Proceeding in the manner as described hereinabove means that there are no dimensional obligations between the substrate plate for the collective fabrication of the chips 2 and the optical plate for the collective fabrication of the electronic devices 1.

Figure 4:
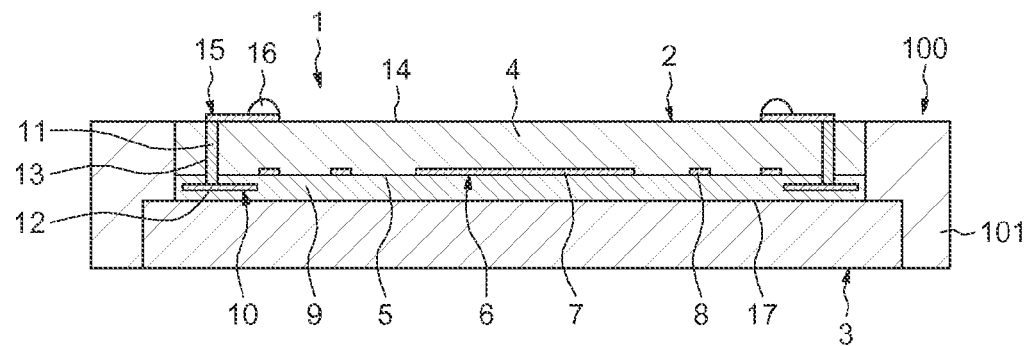
FIG. 4 shows another electronic device.

According to one variant embodiment illustrated in FIG. 4, an electronic device 100 comprises the electronic device 1 and an encapsulation ring 101 made of an opaque material surrounding the periphery of the chip 2 and of the optical plate 3, whose thickness corresponds substantially to the thickness of the electronic device 1 and wherein opposite faces of the encapsulation ring 191 are coplanar with the opposite faces of stacking formed by the chip 2 and the optical plate 3. The opaque ring 101 allows only light radiation reaching the front face of the optical plate 3 to reach the optical sensor 7 through the latter.

The separated electronic device 100 can be mounted onto a printed circuit board, in a manner equivalent to that which is described previously with reference to FIG. 2.

In order to fabricate the electronic device 100, the following procedure may be adopted.

Figure 5:
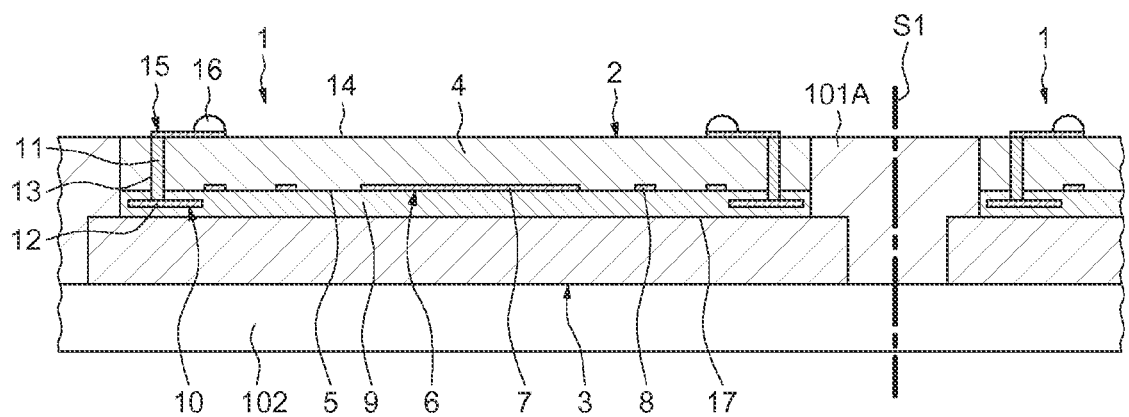
FIG. 5 shows one embodiment of the electronic device in FIG. 4.

As illustrated in FIG. 5, a plurality of electronic devices 1 are placed on a support plate for temporary holding 102, spaced out from one another and according to a matrix.

Subsequently, an encapsulation layer 101A may be formed, for example by spreading, on the support and holding plate 102 and around the electronic devices 1, for example up to the front face of the electronic devices 1.

Then, the layer 101A is sawn through its thickness, according to lines S1, passing at a distance between the electronic devices 1, so as to obtain separated electronic devices 101.

Figure 6:
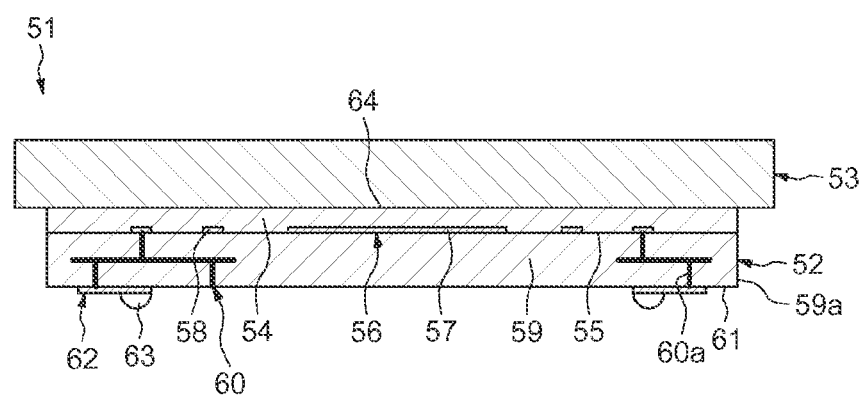
FIG. 6 shows a cross-section of an electronic device.

According to one variant embodiment illustrated in FIG. 6, an electronic device 51 comprises a chip of integrated circuits 52 and an optical plate 53, stacked on top of each other.

The chip 52 comprises a thinned substrate plate 54, generally made of silicon, one face 55 of which is processed in such a manner that it comprises electronic components 56, amongst which are an optical or light sensor 57 arranged on a substantially central region of this face 55, and auxiliary electronic components 58 arranged on the region between this central region and the periphery of this face 55.

On the face 55, a frontal or front layer 59 is arranged including an electrical connection network 60 comprising one or more metal levels and selectively connected to the electronic components 56, this network 60 including electrical connection vias 60a opening out onto a front face 61 of the frontal layer 59 and situated at a distance from the periphery 59a of the frontal layer 59.

On the external face 61 of the frontal layer 59, an electrical connection network 62 is formed, as are external electrical connection elements 63 such as beads, pillars or dots or local thin layers of solder. These electrical connection elements 63 are selectively connected to the electrical connection network 60 by means of the electrical connection network 62.

The optical plate 53 is mounted flush on top of the back face of the chip 2 on the opposite side to the frontal layer 59, by means of a layer of transparent adhesive 64.

Thus, according to this variant embodiment, light radiation can reach the optical sensor 57 passing through the optical plate 53 and through the substrate plate 54 of the chip 52, on the opposite side to the electrical connection elements 63 provided on the frontal layer 59.

The result of the above is that the electrical connection elements 63 are on one side of the chip 52 and that the optical plate 53 is on the other side of the chip 52.

The electronic device 51 can be mounted directly onto a printed circuit board, or other carrier, in a manner equivalent to that which has previously been described with reference to FIG. 2.

The electronic device 51 may also be surrounded by an encapsulation ring made of an opaque material, in a manner equivalent to that which has previously been described with reference in FIG. 5.

The electronic devices which have just been described, in relation with their modes of fabrication, can be such that the substrate plates have a thickness equal to or less than 100 microns and that the optical plates have a thickness equal to or less than 300 microns, in such a manner that the electronic devices obtained, described with reference notably to FIGS. 1 and 4, advantageously have reduced thicknesses.

The present invention is not limited to the examples described hereinabove. Many other variant embodiments are possible, without straying from the scope of the invention.

What is claimed is:

1. An electronic device comprising, in a stack:
    a chip of integrated circuits which comprises a substrate plate including an optical sensor and an electrical connection network, said substrate plate having, on a first side, first electrical connection lugs connected to the electrical connection network through electrical connection vias situated at a distance from a periphery of the substrate plate,
    an optical plate configured to allow light radiation to pass, a rear surface of the optical plate being mounted to a second side of the chip opposite to the first side;
    an encapsulation ring made of an opaque encapsulation material surrounding peripheries of said chip and said optical plate and contacting a portion of the rear surface of the optical plate; and
    wherein the encapsulation ring has a front surface coplanar with a front surface of the optical plate and a rear surface coplanar with the first side.

2. The device according to claim 1, wherein the electrical connection vias are formed through the substrate plate.

3. The device according to claim 1, wherein the electrical connection vias are formed in a layer including said electrical connection network.

4. The device according to claim 1, wherein the chip comprises a thinned substrate plate.

5. The device according to claim 1, further comprising a printed circuit board equipped with second electrical connection lugs connected to the first electrical connection lugs.

6. The device according to claim 1, wherein the substrate plate has a thickness equal to or less than 100 microns.

7. The device according to claim 1, wherein the optical plate has a thickness equal to or less than 300 microns.

8. A device, comprising:
    an integrated circuit chip including an optical circuit formed on a front side of a semiconductor substrate, an interconnection network layer formed on top of the front side of the semiconductor substrate, and a plurality of vias electrically connected to said interconnection network layer and extending through the semiconductor substrate to a back side;
    a rear surface of an optical plate mounted to a front surface of said interconnection network layer;
    an encapsulating body surrounding peripheries of the integrated circuit chip and optical plate and contacting a portion of the rear surface of the optical plate; and
    wherein the encapsulating body has a front surface coplanar with a front surface of the optical plate and a rear surface coplanar with the back side of the integrated circuit chip.

9. The device of claim 8, wherein the plurality of vias is positioned near a periphery of the semiconductor substrate.

10. The device of claim 8, wherein the interconnection network layer includes electrical connection lines, but wherein said electrical connection lines are absent in optical alignment with the optical circuit.

11. The device of claim 8, wherein the encapsulating body is formed of an opaque material.

12. The device of claim 8, further comprising an electrical connection network formed on the back side of the integrated circuit chip.

* * * * *